(12) United States Patent
Ullrich et al.

(10) Patent No.: US 7,975,191 B2
(45) Date of Patent: Jul. 5, 2011

(54) NONVOLATILE MEMORY DEVICE COMPRISING A PROGRAMMING AND DELETION CHECKING OPTION

(75) Inventors: Manfred Ullrich, Denzlingen (DE); Martin Bayer, Vörstetten (DE); Hans-Jörg Fink, Freiburg (DE); Reiner Bidenbach, Vörstetten (DE); Thilo Rubehn, Grundelfingen (DE)

(73) Assignee: Micronas GmbH, Freiburg (DE)

( * ) Notice: Subject to any disclaimer, the term of this patent is extended or adjusted under 35 U.S.C. 154(b) by 527 days.

(21) Appl. No.: 11/417,520

(22) Filed: May 4, 2006

(65) Prior Publication Data

US 2007/0260946 A1 Nov. 8, 2007

(30) Foreign Application Priority Data

May 4, 2005 (DE) .......................... 10 2005 020 808

(51) Int. Cl.
*G11C 29/24* (2006.01)
*G11C 29/50* (2006.01)
(52) U.S. Cl. ........................................ 714/718; 714/733
(58) Field of Classification Search .................... None
See application file for complete search history.

(56) References Cited

U.S. PATENT DOCUMENTS

| | | | | |
|---|---|---|---|---|
| 5,155,852 A * | 10/1992 | Murakami et al. | ............. | 718/100 |
| 5,675,540 A * | 10/1997 | Roohparvar | ............. | 365/185.22 |
| 5,936,976 A * | 8/1999 | Story et al. | ..................... | 714/724 |
| 6,175,603 B1 * | 1/2001 | Chapman et al. | ............. | 375/354 |
| 6,188,603 B1 * | 2/2001 | Takeda | ...................... | 365/185.09 |
| 6,351,428 B2 * | 2/2002 | Forbes | ..................... | 365/230.06 |
| 6,519,195 B2 * | 2/2003 | Kanno et al. | ............. | 365/189.15 |
| 6,754,094 B2 * | 6/2004 | McClure | ........................ | 365/145 |
| 6,993,462 B1 * | 1/2006 | Pavlovi et al. | ..................... | 703/2 |
| 2004/0255090 A1 | 12/2004 | Guterman et al. | ............. | 711/156 |
| 2005/0097153 A1* | 5/2005 | Dirscherl et al. | ............. | 708/250 |

* cited by examiner

*Primary Examiner* — Jeffrey A Gaffin
*Assistant Examiner* — Dipakkumar Gandhi
(74) *Attorney, Agent, or Firm* — Muncy, Geissler, Olds & Lowe, PLLC

(57) ABSTRACT

A method and circuitry for checking the programming (P) and deletion (L) operations of memory cells (5) in a nonvolatile memory device (1). Parallel to the programming (P) or deletion (L) operations of the actual memory cells (5) the respective programming or deletion process is carried out on at least one similar checking cell (4.1, 4.2, 4.3), with the programming (P) or deletion (L) operations being less favorable by a defined extent than the programming (P) or deletion (L) operations of the actual memory cells (5). From the content of the checking cell (4.1, 4.2, 4.3) an evaluation device (6) determines whether the programming (P) or deletion (L) operation was successful or not, and a corresponding output signal (ak) indicative thereof is produced.

23 Claims, 3 Drawing Sheets

| | k4 | k1 | k2 | k3 | +/− | ak |
|---|---|---|---|---|---|---|
| L | 0 | 0 | 0 | 0 | Start 1 | 0 |
| | 0 | 0 | 0 | 1 | + | 1 |
| | 0 | 0 | 1 | 0 | + | 1 |
| | 0 | 0 | 1 | 1 | − | 0 |
| | 0 | 1 | 0 | 0 | + | 1 |
| | 0 | 1 | 0 | 1 | − | 0 |
| | 0 | 1 | 1 | 0 | − | 0 |
| | 0 | 1 | 1 | 1 | − | 0 |
| P | 1 | 0 | 0 | 0 | − | 0 |
| | 1 | 0 | 0 | 1 | − | 0 |
| | 1 | 0 | 1 | 0 | − | 0 |
| | 1 | 0 | 1 | 1 | + | 1 |
| | 1 | 1 | 0 | 0 | − | 0 |
| | 1 | 1 | 0 | 1 | + | 1 |
| | 1 | 1 | 1 | 0 | + | 1 |
| | 1 | 1 | 1 | 1 | Start 2 | 0 |

Fig. 3

NONVOLATILE MEMORY DEVICE COMPRISING A PROGRAMMING AND DELETION CHECKING OPTION

PRIORITY INFORMATION

This patent application claims priority from German patent application 10 2005 020 808.8 filed May 4, 2005, which is hereby incorporated by reference.

BACKGROUND OF THE INVENTION

The present invention relates to the field of nonvolatile memory devices, and in particular to nonvolatile memory devices that include built-in test logic.

Nonvolatile memory devices often pose the problem that it is not discernable whether the nonvolatile memory cells hold their stored values throughout the designated life cycle. This may be linked with a damage of the memory device, which, though not yet bringing about a complete failure at present, most likely will result in a premature storage loss.

There is a need for a memory device that identifies internal damage during normal operation in order to take appropriate protective measures.

SUMMARY OF THE INVENTION

The invention is based on the knowledge that an ongoing or already present damage of nonvolatile memory devices in the majority of cases will be apparent at the beginning in that under unfavorable external conditions the usual programming or deletion operation will no longer be successful. Such behavior is utilized for verifying the reliability of the memory device in that the memory device is equipped with one or more additional checking cells which actually are of the same kind as the normal memory cells and are programmed or deleted simultaneously with these, but under defined less favorable conditions. If after the completed, less favorable programming or deletion operation it is found in one of these checking cells that the expected programming or deletion operation has not occurred, then this will be a first indication that the memory device may be damaged. The storing process will then be repeated to exclude any external disturbances which may be present by hazard. If the error message comes again, one can be quite sure that damage exists in the memory device. Since the verification is carried out at certain intervals or with each storing process, it is possible to automatically initiate appropriate backup steps by the processor which normally is on duty all the time.

So that the less favorable conditions for the programming or deletion operation are defined and reproducible, either the checking cells are designed to be less favorable or one predefines as a less favorable condition at least one of the programming or deletion parameters so as to be less favorable as it is the case with the actual memory cells. The less favorable conditions may include the following parameters: the time during the programming or deletion voltage is applied, its level, the voltage level of the logical "0" or "1" to be stored, the resulting differential voltage across the floating gate of the memory cell or the amount of charge and hence the voltage level in the memory cell, which has to be transferred during the programming or deletion process.

At least two checking cells are required so that the checking process is integrated in the normal programming and deletion process and does not run as a separate process. In the one checking cell the current storing process is carried out under unfavorable conditions and in the other checking cell a preparation for the next storing process takes place. Thus, for driving the two checking cells, a data word is required which comprises at least two digit positions. A preferred embodiment which will be described in more detail below uses three checking cells and one additional memory cell and therefore needs a data word with four digit positions. Due to using three checking cells in combination with one separate memory cell from which the last storing process arises, it is possible to define unambiguous four-digit states that reveal whether the currently performed storing process was successful or not. The evaluation is effected by a logical evaluation device that produces positive or negative confirmation information depending on the result. Particularly suitable for the generation of the data words is a logical device that composes a new data word from the data word that is picked up at the outputs of the checking cells and corresponds to a definite state. This new data word is supplied to the inputs of the checking cells as the new test word. In the Anglo-Saxon linguistic usage such logical association devices are referred to as "state machine".

The supervision of the memory properties will be particularly meaningful if not only the currently performed storing process is analyzed for the evaluation, but also the preceding alternative storing process is still available. This is already possible with three checking cells. A first checking cell verifies the current storing process, a second cell shows the result of the preceding alternative storing process, and a third cell is prepared for the next test with a memory content suited to this end.

The evaluation in terms of a successful programming or deletion operation will be ascertained by an evaluation device from the voltage level of the content of at least one checking cell, with either the real voltage level being evaluated or the evaluation being made by a comparison with one or more threshold values. It is particularly advantageous if in the latter case just the threshold value(s) is/are used which in the actual memory cells determine/s the content to be a logical "0" or "1". On the one hand, the determination criteria for the normal memory cells and checking cells are largely identical, and, on the other hand, logical conjunctions with the result from the checking cells are made possible straight away.

These and other objects, features and advantages of the present invention will become more apparent in light of the following detailed description of preferred embodiments thereof, as illustrated in the accompanying drawings.

BRIEF DESCRIPTION OF THE DRAWINGS

FIG. 3 shows a truth table for an evaluation with three checking cells.

DETAILED DESCRIPTION OF THE INVENTION

Figure 1:
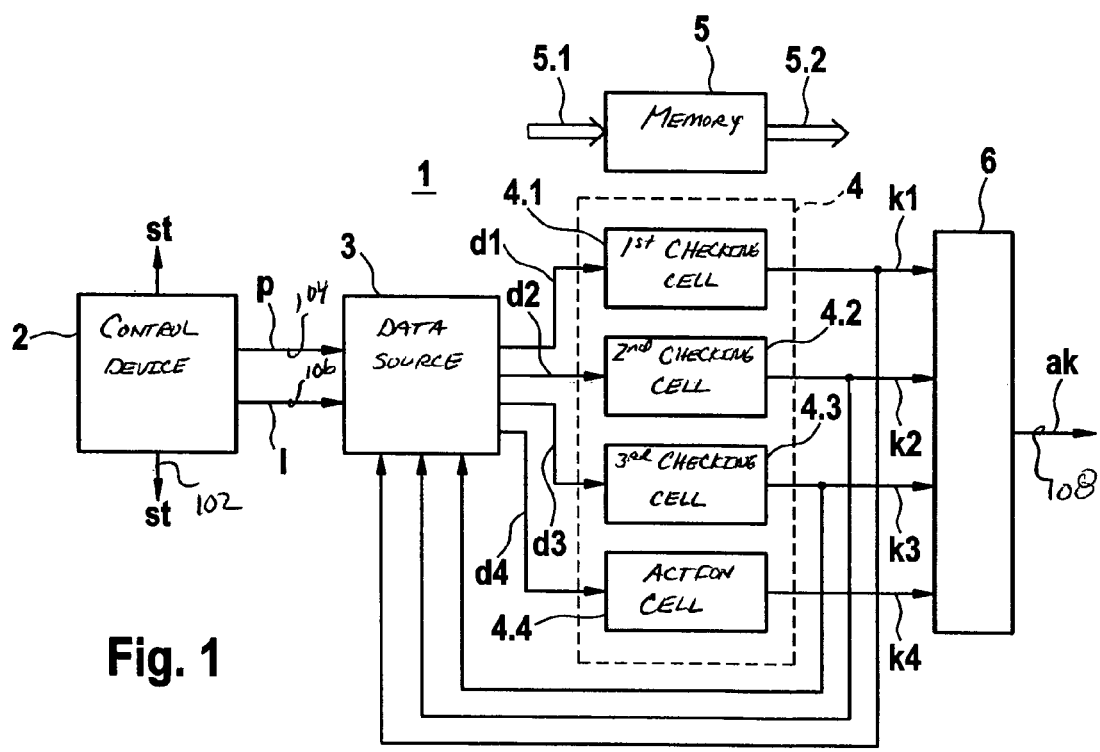
FIG. 1 is a block diagram illustration of a memory device including programming and deletion checking logic.

FIG. 1 essentially illustrates only those functional blocks of a nonvolatile memory device 1 which are required for the invention. The actual memory cells are located in a memory area 5 together with the associated bus links 5.1 and 5.2. The known functional units of a nonvolatile memory device 1 such as data and signal lines, clock devices, devices for data and address management, voltage supply devices et cetera are omitted for better clarity or are parts of the illustrated functional units. Thus, a control device 2 produces control signals on a line 102 for the entire nonvolatile memory device 1. A data source 3 composes the input data for the at least one checking cell in a checking area 4. In a preferred embodiment of FIG. 1 the checking area 4 includes three checking cells 4.1, 4.2 and 4.3 which can be separately driven by the data source 3 with input data d1, d2, d3 and are to be as similar as possible to the actual memory cells in the memory area 5. The checking area 4 further includes an action cell 4.4 which is driven by the data source 3 with an input data value d4 and in which is registered whether the current storing process is a programming or deletion operation. Although the pure read-out of stored data from the normal memory area 5 is a storing process, too, it is of no relevance to the checking function and therefore will not be recorded in the checking area 4. Each of the cells 4.1 to 4.4 in the checking area 4 stores only one logical state (i.e., a logical "0" or a logical "1"). Since composing the output data d1, d2, d3 and d4 of the data source 3 depends on whether the test is a programming or deletion operation, the data source will be supplied by the control device 2 with a corresponding programming or deletion signal p and l on lines 104, 106, respectively. The control of the actual programming or deletion operation of the memory cells in the memory area 5 and in the checking area 4 is effected by the control device 2 by the control signals which for simplification purposes are only signified in FIG. 1.

Reading out the memory cells 4.1 to 4.4 in the checking area 4 is effected by an evaluation device 6 polling the four output data k1 to k4 of the three checking cells 4.1 to 4.3 and the one action cell 4.4 in a parallel or serial fashion. From the read-out data the evaluation device 6 composes confirmation or fault information which is output as an output signal ak on a line 108 for further processing. In the simplest case it is only the failure of the memory device which is signalized, and the programming or deletion operation is carried out once again, if necessary. Another possibility is that the connected system passes over into a neutral state without using the nonvolatile memory device. With several nonvolatile memory devices, when a fault is detected the defective device can be switched off and another one can be used as a substitute.

Figure 2:
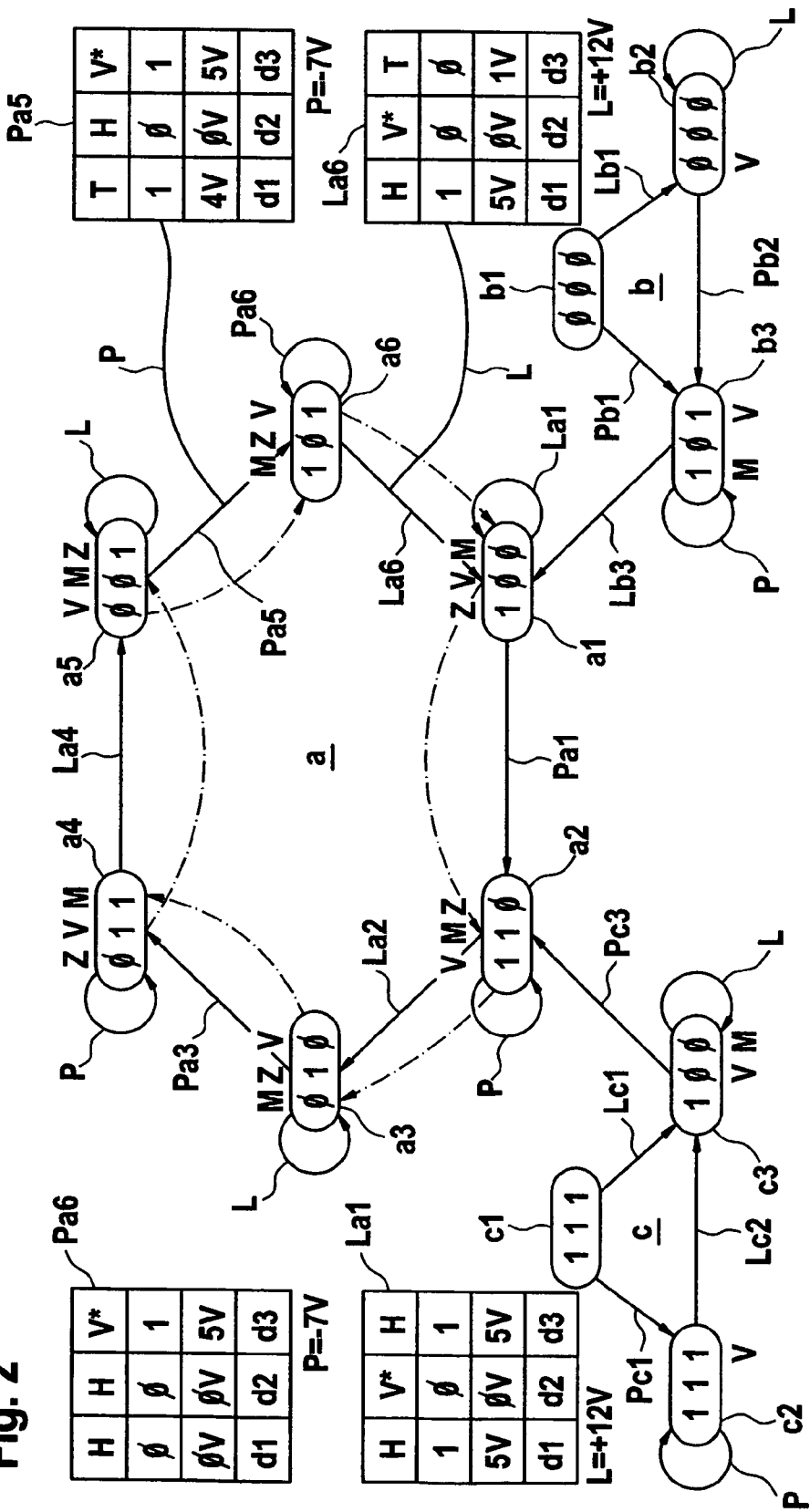
FIG. 2 illustrates a flow diagram with three checking cells.

For the illustrated embodiment of the invention the output data of the checking area 4 is feedback to the data source 3. With these feedbacks the data source 3 produces a logical state sequence which defines the new input data d1 to d4 corresponding to the respective initial state which is determined by the output data of the checking area 4. In FIG. 2 such a sequence is illustrated in detail in the form of a flow diagram. As already mentioned, in the Anglo-Saxon linguistic usage this logical device for composing a defined flow sequence is referred to as "state machine". Associating the discrete sequence states is unambiguous here, so that a malfunction within the loop can immediately be detected from a discrepancy. It is therefore only required to retain in a tabular form in the evaluation device 6 the constrained sequence of the state sequences described by the input and output data d1 to d4 and k1 to k4, respectively, with which the physically arriving new output data k1 to k4 are then compared. Another possibility is the direct addressing of a table when the data outputs from the data source 3 are also supplied to the evaluation device 6.

When the programming and deletion operations follow each other alternatingly, a checking is possible in each step and the number of the required checking cells is reduced. If this alternating mode of operation is not maintained reliably, one has to increase the number of checking cells or a measurement is only possible in case of a change of the storing process. With the three checking cells 4.1 to 4.3 and the action cell 4.4 in the embodiment of FIG. 1 the evaluation is particularly simple, because in this case the checking process in an alternating storing process can be controlled such that it can be recognized solely from the output data word k1 to k4 of the checking area 4 whether the storing process is successful or not. The operation of the system shall now be discussed with respect to the flow diagram of FIG. 2 and the associated truth table in FIG. 3.

FIG. 2 shows a flow diagram using three checking cells 4.1, 4.2, 4.3 according to the embodiment of FIG. 1. The diagram is divided in three areas, namely a main loop a and a first and second start loop b and c, respectively. In the corners of the three loops are illustrated in rounded fields from the left to the right the respective three initial states k1, k2 and k3 of the associated checking cells 4.1, 4.2 and 4.3 as a logical "0" or logical "1". The succeeding states are numbered consecutively in the diagram, with the designation preceding the respective loop. The flow sequence requires that programming and deletion operations follow each other alternatingly. The main loop a has six discrete states a1 to a6 until the loop starts again at state a1.

Apart from the main loop a there is the first start loop b, which starting from a first start value b1 either reaches a state b2 via a deletion process Lb1 or reaches a state b3 via a programming process Pb1. State b3 can also be reached via state b2, if state b2 is followed by a programming process Pb2. From state b3 one arrives via a deletion process Lb3 at state a1 in the main loop a. Further programming or deletion processes will not lead out of the main loop a anymore. The starting process via the first start loop b is then required when all memory cells, hence also those present in the checking area 4, are deleted, that is show a logical "0", which is the desired delivery state in most cases.

The second start loop c describes a similar starting process, which applies to the case where all memory cells contain the logical "1". The starting process then begins at a state c1, which is followed by a programming process Pc1 or a deletion process Lc1, resulting in the state c2 and c3, respectively. Via a deletion process Lc2 one can also reach state c3 starting from state c2. From state c3 one finally arrives via a programming process Pc3 at state a2 of the main loop a. Thus, one has arrived at main loop a which then allows statements on the success or failure of the further programming or deletion processes.

Upon consideration of the states b3 and a6 one could presume that these are identical states, because the associated data words "101" are identical and both are converted to state a1 exhibiting "100" by deletion processes Lb3 and La6, respectively. The difference is that with state b3 the checking cell 4.2 has no information Z about a preceding memory test. The logical content "0" of the checking cell 4.2 still originates more or less from the manufacturing process. In state a6 in the main loop a this information Z, which shows the behavior of the checking cell 4.2 during the preceding deletion test La4, is present and hence can be evaluated.

For the embodiment of FIG. 2 it is assumed that during the programming operation, designated "P" or with affixes "P . . . " in the diagram, a programming voltage of −7V is applied across the floating gate of the respective memory or checking cell, and that during deletion, designated "L" or with affixes "L . . . " in the diagram, a deletion voltage of +12V is applied. The voltage range from about 0V to +2V corresponds to a logical "0" and the voltage range from about +3V to +5V corresponds to a logical "1". During a programming operation P, a supplied "0" causes no change in the respective memory cell, irrespective of whether the current content is a logical "0" or "1". A supplied "1", however, causes the "1" to be adopted, in other words to be written in the respective memory cell. During deletion L, a supplied "0" causes the content of the cell to adopt the logical "0" irrespective of the previous state, that is, the content is deleted. A supplied "1", however, will not cause any change in the respective memory cell content. In case a logical "0" was stored therein, this value will be maintained. In case the value was a logical "1", this value likewise remains stored in the cell.

In the illustrated embodiment of FIG. 2, the input voltages d1 to d3 applied to the checking cells 4.1 to 4.3 are modified for testing the respective storing process. The adoption of the input voltage applied to the checking cell only occurs when the differential voltage across the respective floating gate is large enough. In our embodiment the memory cells in the area 5 are designed such that the required differential voltage is 12V, which then is made available in this level to the voltage supply device. As regards the similar checking cells 4.1 to 4.3 it is possible for the test period to decrease the differential voltage existing therein, by modifying the input voltages d1 to d3 produced by the data source 2, whereby the programming or deletion success with damaged checking cells 4.1 to 4.3 significantly declines.

During a programming operation P, in which a programming voltage of −7V is applied to the floating gates of the memory and checking cells 4.1 to 4.3, a modification of the voltage for the logical "0" lying at 0V is irrelevant, because the resultant differential voltage amounts to about 7V and therefore is too small to yield an effect in the associated checking cell. With the logical "1" being at +5V the situation is different. The resultant differential voltage is 12V here and thus has the required value. If the input voltage d1 to d3 applied to a checking cell is now reduced to +4V, this still corresponds to a logical "1", but the resultant differential voltage only amounts to 11V. This is a voltage value which perhaps does not lead to a successful storing with faulty storage cells and, with this, also faulty checking cells, hence serving as a test value for the measurement of the programming success.

During a deletion operation L, in which a deletion voltage of +12V is applied to the floating gates of the memory and the checking cells 4.1 to 4.3, a modification of the logical "1" being at +5V is irrelevant, because the resultant differential voltage amounts to about 7V and therefore is too small to yield an effect in the associated checking cell. With the voltage for the logical "0" being at 0V the situation is different. The resultant differential voltage is 12V here and thus has the required value. If the input voltage d1 to d3 applied to one of the checking cells 4.1. to 4.3 is now increased to +1V, this still corresponds to a logical "0", but the resultant differential voltage only amounts to 11V. This is a voltage value which perhaps does not lead to a successful deletion with faulty storage cells and, with this, also faulty checking cells, hence serving as a test value for the measurement of the deletion success.

Modifying the input voltages d1 to d3 represents an easy to handle parameter available for the test of the storing processes. An important advantage in this case is that also the extent of deterioration of the checking cells 4.1 to 4.3 compared to the actual memory cells in the memory area 5 can be adjusted through the level of input voltages d1 to d3. The higher the discrepancies of the input voltages d1 to d3 from the desired values 0V and +5V, the larger the amount of deterioration is, and the earlier faulty memory cells will be identified.

For the supervision of the storing processes it is important that not only the transitions as such, but also particularly unfavorable constellations are detected in this process. For instance, in the deletion process L of a logical "1", if there is a particularly high voltage value in the memory, that is in the range of +5V or even higher. If the differential voltage is too low, the deletion time is not long enough or another damage is present, then this voltage value will not drop to a sufficiently low level, so that the evaluation device 6 will still interpret the content as a logical "1". Similarly with the programming process P of a logical "1", when the associated memory cell contains a logical "0" with a particularly low voltage value, that is in the range of 0V or even less. If the differential voltage is too low, the programming time is not long enough or another damage is present, then the charge transfer controlled by the floating gate may be too low to reach the voltage value required for a logical "1". The content of the checking cell thus will be erroneously interpreted as a logical "0" by the evaluation device. For adjusting the contents of the checking cell, which will be subjected to the test in the next step, to one of the unfavorable levels +5V or 0V, each state a1 to a6 of the main loop a in FIG. 2 has a checking cell 4.1 to 4.3 which is in a preparatory state V. The content stored therein has a value of either +5V or 0V, complying with the following storing process L and P, respectively.

That one of the checking cells 4.1 to 4.3, at which the current storing process L or P has just been carried out as a test, is designated M (=measurement) in FIG. 2. The previous programming or deletion processes P and L, respectively, were made with the input voltage values +4V and +1V, respectively. Finally, checking cells 4.1 to 4.3 designated "Z" and containing the measured value of the preceding alternative storing process, are present in the flow diagram of FIG. 2. In the main loop a the checking cells 4.1 to 4.3 are in one of the states V, M or Z. This is not the case in the two start loops b, c. For the states b2 and c2 only one checking cell is prepared in each case. This also applies to the states b3 and c3, if they are directly reached starting from the associated start value b1 or c1. If they are reached via the state b2 or c2, however, then a test procedure has already been executed in the previously prepared checking cell, so that a measuring state M exists in b3 or c3. As already mentioned, the next steps Lb3 and Pc3 will then lead into the main loop a to the states a1 and a2, respectively, in which all checking cells 4.1 to 4.3 exhibit one of the states V, M, Z. For clarification, which one of the checking cells 4.1 to 4.3 is involved in the reliability test during the respective storing process, the main loop a has dot and dash arrows which highlight the checking cell involved in the measuring process in each case. Each preparatory value V will become a measuring cell M in the subsequent state, which is illustrated by the dot-dash arrows.

For the regular run of the memory function an alternating operation between the deletion L and programming P operations is assumed. So as to re-establish the resumption of the regular operation in the shortest possible time also in case of variations from the alternating operation, the data source 3 produces input data d1 to d3 also for the irregular storing process, which data are symbolized in FIG. 2 by small loops P, L at the individual states. They will then be realized when a regular deletion process L is followed again by one or more deletion processes L, and also when a regular storing process P is followed again by one or more storing processes P. The data source 3 thereby attempts to maintain the current state of the three checking cells 4.1 to 4.3 in the best possible way.

For two regular programming processes, programming step Pa5 and deletion step La6, and two irregular programming processes, programming step Pa6 and deletion step La1, the input data d1 to d3 delivered by the data source 3 are illustrated in FIG. 2 in four separate fields. Apart from the logical level "0" and "1", the actual voltage value also is indicated and whether the respective data value is a test value T, a hold value H or a preparatory value V*. The reliability measurement of the respective checking cell is performed using the test value T. The hold value H only provides for the voltage value in the cell being held, if possible. And the preparatory value V* puts the content of the respective checking cell in a state which is as unfavorable as possible for the subsequent testing process. From the irregular storing processes can be seen that there is essentially a maintaining of the current states. For the one checking cell being in the preparatory state V, this state expediently will not be additionally maintained by a hold function H, but will be rather performed as a new preparation V*.

In the main loop a there exist no dual states, whereas these actually do exist when the two start loops b, c are incorporated. The presence of a default can not be ascertained on the basis of the states alone which are illustrated in FIG. 2, even not in case of being aware which one of the checking cells 4.1 to 4.3 has to be changed at all. This will only be possible if one knows whether the current cell content is based on a programming or deletion operation. State a2 showing "110" may be a correct consequence of the programming step Pa1, but also a consequence of a faulty deletion La2, the latter yielding the wrong result "110" instead of the correct state a3 exhibiting "010". The way how to obtain an unambiguous confirmation or error information ak, is shown in FIG. 3, for instance.

FIG. 3 shows a truth table associated to the flow diagram of FIG. 2. Ordered in four columns from the left to the right, this table contains the output data value k4 of the action cell 4.4 and the output data k1 to k3 of the three checking cells 4.1 to 4.3. The output data value k4 of the action cell 4.4 indicates which one of the storing processes it is where a quality statement is made. A logical "0" corresponds to a deletion operation L and a logical "1" corresponds to a programming operation P. The column "+/−" shows whether the four output data k1 to k4 represent a successful storing process or not; the positive sign "+" represents a successful storing process and the negative sign "−" an unsuccessful storing process. The column further contains information on the first starting state b1 provided by the manufacturer, in which all memory cells are cleared, or on the second possible starting state c1 in which all memory cells are loaded; the latter state is generally not in demand. The last column contains the confirmation information ak produced by the evaluation device 6, indicating, for instance, a successful storing process by a logical "1", and an unsuccessful storing process by a logical "0", to other circuit components for further processing.

Although the present invention has been illustrated and described with respect to several preferred embodiments thereof, various changes, omissions and additions to the form and detail thereof, may be made therein, without departing from the spirit and scope of the invention.

What is claimed is:

1. A nonvolatile memory device, comprising:
a memory cell;
a first binary checking cell that provides a first bit signal;
a second binary checking cell that provides a second bit signal;
a binary action cell that provides a third bit signal;
a control device that provides a program control signal;
a data source that receives the program control signal and the first and second bit signals, and, based on a logic operation on said program control signal and said first and second bit signals, provides a first checking data signal to the first binary checking cell, a second checking data signal to the second binary checking cell, and an action data signal to the binary action cell; and
an evaluation device that receives and compares the first, second and third bit signals and provides a confirmation signal indicative of whether or not the memory cell is correctly storing data.

2. The nonvolatile memory device of claim 1, wherein a first value of the program control signal indicates whether a storing process is to be performed on one of the first or second binary checking cells, a second value of the program control signal indicates a deletion process is to be performed on said one of the first or second binary checking cells, and wherein said action binary cells generates said third bit signal with a value indicating which of said storing process or deletion process has been performed.

3. The nonvolatile memory device of claim 1, wherein a voltage level of the first checking data signal supplied to the first binary checking cell controllable between a normal value and a degraded value and a voltage of the second checking data signal supplied to the second binary checking cell is controllable between a normal value and a degraded value, wherein said voltage levels of said first and second checking data signals are controlled individually.

4. The nonvolatile memory device of claim 1, wherein the evaluation device further comprises a truth table for producing positive or negative confirmation information reflecting a result of a state transition operation.

5. The nonvolatile memory device of claim 4, wherein the first and the second bit signal output by the first and the second checking cell, and the third bit signal output by the action cell, serve as addresses for the truth table.

6. The nonvolatile memory device of claim 1, wherein each of said first and second binary checking cells is configured to switch between a first and a second binary state, and
wherein the data source generates said first and second checking data signals and the action data signal so that, in response to said first and second checking data signals and the action data signal, one of the first or the second binary checking cells performs a state transition operation from an initial state to a next state, said initial state being one of a first binary state or a second binary state and said next state being the other of said first or second binary state, and the other of said first or second binary checking cells provides a bit signal representing said initial state of said one of the first or second binary checking cells corresponding to said state transition operation.

7. A nonvolatile memory device, comprising:
a memory cell;
a first binary checking cell that provides a first bit signal;
a second binary checking cell that provides a second bit signal;
a third binary checking cell that provides a third bit signal;
a binary action cell that provides a fourth bit signal;
a control device that provides a program control signal;
a data source that receives the program control signal and the first, second and third bit signals, and, based on a logic operation on said program control signal and said first, second and third bit signals, provides a first checking data signal to the first binary checking cell, a second checking data signal to the second binary checking cell, a third checking data signal to the third binary checking cell and an action data signal to the binary action cell; and
an evaluation device that receives and compares the first, second and third bit signals and provides a confirmation signal indicative of whether or not the memory cell is correctly storing data.

8. The nonvolatile memory device of claim 7, wherein each of said first, second and third binary checking cells is configured to switch between a first and a second binary state, and wherein the data source generates said first, second and third checking data signals and the action data signal so that, in response to said first, second and third checking data signals and the action data signal, one of the first, second or third binary checking cells performs a state transition operation from an initial state to a next state, said initial state being one of a first binary state or a second binary state and said next state being the other of said first or second binary state, and another of the first, second or third binary checking cells provides a bit signal representing said initial state of said one of the first, second or third binary checking cells corresponding to said state transition operation.

9. A storage, comprising:
a memory cell configured to receive an input data and update a state of the memory cell based, at least in part, on the input data;
a checking data source for generating an N-bit checking data and an action data indicating a storage action selectable between a programming action and a deletion action;
N checking cells, each switchable by a storage operation between two binary states to form an N-bit state, configured to receive the N-bit checking data and the action data and perform a storage operation causing a state transition from a present N-bit state to a next N-bit state based, at least in part, on the value of the received N checking bits and the storage action indicated by the action data, whereby said present N-bit state becomes a previous N-bit state and said next N-bit state becomes the present N-bit state; and
an evaluation circuit for detecting said state transition and generating a validity data indicating whether said state transition is a valid state transition or an invalid state transition, based on a given state transition rule,
wherein for at least one valid state transition from a previous N-bit state to a present N-bit state, a state of a first of said N checking cells in the present N-bit state indicates a state of a second of said N checking cells in the previous N-bit state.

10. The storage of claim 9, wherein said checking data source is configured to receive said present N-bit state resulting from said state transition and generate a next N-bit checking data based, at least in part, on said present N-bit state.

11. The storage of claim 10, wherein said checking data source is further configured to generate a next action data in association with said next N-bit checking data, and wherein said N checking cells are configured to perform a storage operation causing a state transition from said present N-bit state to another next N-bit state based, at least in part, on the next N-bit checking data and the next action data, whereby said present N-bit state becomes the previous N-bit state and said another next N-bit state becomes the present N-bit state.

12. The storage of claim 11, wherein said checking data source and said N checking cells are configured to perform a state machine operation, said state machine operation comprising: i) said checking data source detecting a new N-bit state as a present N-bit state, ii) said checking data source generating a next N-bit checking data and another action data based, at least in part, on said present N-bit state, iii) said N checking cells performing a storage operation causing a state transition from said present N-bit state to a next N-bit state based, at least in part, on the next N-bit checking data and the next action data, and iv) repeating operations (i), (ii) and (iii) in succession a plurality of times, each time causing another state transition of the N checking cells.

13. The storage of claim 12, wherein said checking data source is configured to generate said N-bit checking data such that, in response to said N checking bits performing said storage operation at (iii) such that said state transition meets a given criteria of proper operation, said repeating at (iv) causes a history of said state transitions at (iii) to be according to a given state machine that includes said state transition rule.

14. The storage of claim 13, wherein said given state machine includes R valid N-bit states, each of said valid N-bit states connected to another of said N-bit valid states by a valid state transition.

15. The storage of claim 14, wherein each of said valid state transitions defines a transition rule from an associated previous N-bit state to an associated present N-bit state, and wherein, for each of said valid state transitions, a state of a particular one of said N checking cells in the associated present N-bit state indicates a state of a particular another one of said N checking cells in the previous N-bit present state.

16. The storage of claim 12 wherein said N checking cells are configured to perform at iii) said storage operation on at least one of said checking cells according to a variable condition, said variable condition being switchable between a normal condition value and a degraded condition value.

17. The storage of claim 12, wherein said N checking cells are configured to perform at iii) said storage operation according to a variable condition on a particular one of said N checking cells, wherein which of said N checking cells is said particular one depends, at least in part, on said next N-bit checking data.

18. The storage of claim 9, further comprising a control device generating a storage action command, wherein said checking data source generates said action data based, at least in part, on said storage action command.

19. The storage of claim 9, further comprising an action cell for storing the action data indicating the storage action corresponding to said storage operation causing said state transition.

20. The storage of claim 9 wherein said N checking cells are configured to perform said storage operation on at least one of said checking cells according to a variable condition, said variable condition being switchable between a normal condition value and a degraded condition value.

21. The storage of claim 20, wherein said N checking cells are configured to perform said storage operation according to a variable condition on a particular one of said N checking cells, wherein which of said N checking cells is said particular one depends, at least in part, on the N-bit checking data.

22. The storage of claim 21, wherein said normal condition value and degraded condition value each depend, at least in part, on said action data.

23. The storage of claim 20, wherein said normal condition value and degraded condition value each depend, at least in part, on said action data.

* * * * *